US008781795B2

(12) United States Patent
Rahman et al.

(10) Patent No.: US 8,781,795 B2
(45) Date of Patent: Jul. 15, 2014

(54) STRUT AND TIE METHOD FOR WAFFLE SLABS

(75) Inventors: Muhammad Kalimur Rahman, Dhahran (SA); Sunil Kumar G. Pillai, Dammam (SA); Mohammed Hussain Baluch, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 317 days.

(21) Appl. No.: 13/323,644

(22) Filed: Dec. 12, 2011

(65) Prior Publication Data

US 2013/0151204 A1 Jun. 13, 2013

(51) Int. Cl.
*G06F 17/50* (2006.01)
*G06F 19/00* (2011.01)

(52) U.S. Cl.
USPC .............................. 703/1; 700/182

(58) Field of Classification Search
CPC . G06F 17/50; G06F 17/5004; G06F 17/5018; G06T 17/20
USPC ............................ 703/1; 700/182
See application file for complete search history.

(56) References Cited

PUBLICATIONS

Park et al., Automated Finite-Element-Based Validation of Structures Designed by the Strut-and-Tie Method, Feb. 2010, Journal of Structural Engineering , vol. 136, No. 2, pp. 203-210.*
Tjhin and Kuchma, Integrated Analysis and Design Tool for the Strut-and-Tie Method, Mar. 30, 2007, Eng. Struct. 29, pp. 3042-3052.*
Lee Scott Cunningham, Automatic Design of Concrete Structures Using a Strut & Tie Approach, Jun. 2000, Doctor of Philosophy Thesis, Dept. of Civil Engineering, University of Glasgow, pp. 1-319.*
Alshegeir and Ramirez, Computer Graphics in Detailing Strut-Tie Models, Apr. 1992, Journal of Computing in Civil Engineering, vol. 6, No. 2, pp. 220-232.*
Tiller, Strut-and-Tie Model for Punching Shear of Concrete Slabs, 1995, Master of Engineering Thesis, Memorial University of Newfoundland, pp. iii, iv.*
Zhi-Qi He and Zhao Liu, Optimal Three-Dimensional Strut-And-Tie Models for Anchorage Diaphragms in Externally Prestressed Bridges, 2010, Engineering Structures 32, pp. 2057-2064.*
Galeb and Atiyah, Optimum design of reinforced concrete waffle slabs, Jan. 2011, International Journal of Civil & Structural Engineering, vol. 1 Issue 4, pp. 862-880.*
Liang-Jeng Leu; Chang-Wei Huang; Chuin-Shan Chen; and Ying-Po Liao, Strut-and-Tie Design Methodology for Three-Dimensional Reinforced Concrete Structures, *J. Struct. Engrg.*, 132, Jun. 6, 2006.
Strut-and-tie model for waffle slabs, Conference on Structural Engineering Mechanics and Computation, Sep. 6-8, 2010, M.K. Rahman, S.K.G Pillai, M. H. Baluch.
Design Using the Strut-and-Tie Method, Part 1, ACI Spring 2010 Xtreme Concrete Convention, Mar. 21-25, Chicago, IL.

* cited by examiner

*Primary Examiner* — Kamini S Shah
*Assistant Examiner* — Juan Ochoa
(74) *Attorney, Agent, or Firm* — Richard C. Litman

(57) ABSTRACT

The strut and tie method for waffle slabs relates to computer modeling of waffle slabs to predict strength and mode of failure. The waffle slab strut and tie method utilizes a three-dimensional strut-and-tie model, which is applied to distinct structural features of waffle slabs. Individual ribs in the slab form two-dimensional trusses, which are connected with perpendicular trusses at rib intersections. The geometry of the slab defines the location of nodes for finite element analysis.

21 Claims, 26 Drawing Sheets

General Data

Title : DESIGN OF WAFFLE SLAB – STRUT & TIE METHOD

Engineer's Name: SKG

Date: 9/15/2010

Concrete Properties

| | | | | |
|---|---|---|---|---|
| Compressive Strength f'c | 20 | MPa | 2900.8 | psi |
| Modulus of Elasticity (Normal Weight concrete) | 21166.7 | MPa | 3069.3673 | ksi |
| Poisson's Ratio | 0.2 | | | |
| Density Concrete | 25 | kN/m3 | | |

Reinforcement Properties

| | | | | |
|---|---|---|---|---|
| Yield Strength | 415 | MPa | 60190.7 | psi |
| Modulus of Elasticity | 200000 | MPa | 29007.5 | ksi |
| Poisson's Ratio | 0.3 | | | |
| Density Steel | 77 | kN/m3 | | |

[Next]

Enter Dimensions of Waffle Slab

Depth of Waffle Slab

Slab Thickness (mm) [75]

Total Depth - including slab (mm) [600]

Span of Waffle Slab (mm)

X dir [10000]

Y dir [10000]

[Previous] [Next]

Plan Your Waffle Slab

Waffle Wall Details

Waffle Rib Thickness (mm) [200]
Waffle Rib Depth (mm) [525]

*X-Dir*

Number of Waffle openings [10]
Waffle spacing C/C (mm) [1000]

*Y-Dir*

Number of Waffle openings [10]
Waffle spacing C/C (mm) [1000]

NOTE: Thickness of rib at support should be at least same as normal rib.

[Previous] [Next]

Reinforcement Details & Depth of Compression Block

Rib Bottom Reinforcement

| | X-Direction | Y-Direction | |
|---|---|---|---|
| Diameter of bar | 20 | 20 | mm |
| Number of bars in each Rib | 3 | 3 | Nos |
| Area of Reinforcement | 942.48 | 942.48 | mm2 |
| Over strength factor for reinforcement | 1.25 | | |

☑ With Stirrups

Stirrup Reinforcement

| | X-Direction | Y-Direction | |
|---|---|---|---|
| Diameter of bar | | 8 | mm |
| Number of stirrup legs | | 2 | Nos |
| Area of Stirrup | | 100.5312 | mm2 |

Reinforcement Cover

| | | |
|---|---|---|
| Effective Cover for bottom bars | 50 | mm |

Assumed Depth of compression block

| | | |
|---|---|---|
| | 50 | mm |

Note: To be <= slab thickness

[Previous]   [Next]

*Fig. 8*

Uniformly Distributed Loads

<u>Dead Load</u>

☐ Calculate Self Weight

Uniformly Distributed Dead load  [ 4 ]  kN/m2

<u>Live Load</u>

Uniformly Distributed Live load  [ 5 ]  kN/m2

<u>Load Combinations</u>

Uniformly Distributed loads-Service Loads
(1.0 DL+1.0 LL)  [ 9 ]  kN/m2

Uniformly Distributed loads-Factored Loads
(1.2 DL+1.6 LL)  [ 12.8 ]  kN/m2

[ Previous ]              [ OK ]

Design of Bottom Reinforcement

Calculation of strength as per ACI-318-08

|  | X-Direction | Y-Direction |
|---|---|---|
| Area of Reinforcement As (sq-mm) | 942.48 | 942.48 |
| Yield Strength of Steel, Fy (MPa) | 415 | |
| Strength Reduction factor $\phi$ | 0.75 | |
| Over strength factor for reinforcement $\Omega$ | 1.25 | |
| Allowable Strength of Tie (kN) $\phi * \Omega * As * Fy$ | 366.684 | 366.684 |
| Maximum Member Force (kN) | 238.919 | 238.919 |
| Stress Ratio | 0.652 | 0.652 |

Close

*Fig. 11*

Deflection

Short-term Deflection
Maximum Deflection at center of slab  [ 3.0557806176 ]  mm

Long-term Deflection
Creep coefficient  [ 2 ]
Maximum Deflection at center of slab  [ 9.1673418529 ]  mm = Short Span / [ 1090.8287440 ]

Note: Deflection calculated as per Orthotropic Plate Theory.

[ Calculate Deflection ]          [ Close ]

Strut Sizes

Top Chord

| | X-Direction | Y-Direction | |
|---|---|---|---|
| Width of Topchard | 680 | 680 | mm |
| Depth of Topchard | 25 | 25 | mm |
| Area of C/S Topchord | 17000 | 17000 | mm2 |

Inclined Struts

| Angle of Diagonal Struts | 25.95 | 25.95 | Degree |
| Width of Diagonal Struts | 200 | 200 | mm |
| Depth of Diagonal Struts | 110 | 110 | mm |
| Area of C/S Diagonal Struts | 21999.7 | 21999.7 | mm2 |

Top Bracing Struts

| Angle of Struts | | 45 | Degree |
| Width of Struts | | 232.2 | mm |
| Depth of Struts | | 50 | mm |
| Area of C/S Struts | | 16976 | mm2 |

[Previous]   [Next]

Design of Bottom Reinforcement

Calculation of strength as per ACI-318-08

| | X-Direction | Y-Direction |
|---|---|---|
| Area of Reinforcement, As (sq-mm) | 628.32 | 628.32 |
| Yield Strength of Steel, Fy (MPa) | 415 | |
| Strength Reduction factor $\phi$ | 0.75 | |
| Over strength factor for reinforcement $\Omega$ | 1.25 | |
| Allowable Strength of Tie (kN) $\phi * \Omega * As * Fy$ | 244.456 | 244.456 |
| Maximum Member Force (kN) | 238.348 | 238.348 |
| Stress Ratio | 0.975 | 0.975 |

Design of Top Chord

Calculation of strength as per ACI-318-08

| | X-Direction | Y-Direction |
|---|---|---|
| Area of Top Chord, Acs (sq-mm) | 17000 | 17000 |
| Compressive Strength of Concrete, f'c (MPa) | 20 | |
| Strength Reduction factor $\phi$ | 0.75 | |
| $\beta_s$ (For Struts of uniform Cross Section) | 1.0 | |
| Allowable Strength of Strut (kN) $\phi * \beta_s * 0.85 * f'c * Acs$ | 216.75 | 216.75 |
| Maximum Member Force (kN) | 149.886 | 149.886 |
| Stress Ratio | 0.691 | 0.691 |

Close

Design of Diagonal Struts

Calculation of strength as per ACI-318-08

| | X-Direction | Y-Direction |
|---|---|---|
| Area of Strut, Acs (sq-mm) | 21999.7 | 21999.7 |
| Compressive Strength of Concrete, f'c (MPa) | 20 | |
| Strength Reduction factor  φ | 0.75 | |
| β s (For Struts of Nonuniform Cross Section) | 0.75 | |
| Allowable Strength of Strut (kN) φ * β s * 0.85 * f'c * Acs | 210.372 | 210.372 |
| Maximum Member Force (kN) | 110.58 | 110.58 |
| Stress Ratio | 0.526 | 0.526 |

Close

Design of Stirrups

Calculation of strength as per ACI-318-08

Area of Reinforcement, As (sq-mm) [201.0624]

Yield Strength of Steel, Fy (MPa) [415]

Strength Reduction factor $\phi$ [0.75]

Allowable Strength of Tie (kN)
$\phi * As * Fy$ [52.581]

Maximum Member Force (kN) [32.045]

Stress Ratio [0.512]

[Close]

1900

*Fig. 19* frmDesignNodaZoneBottom

Calculation of strength as per ACI-318-08

| | X-Direction | Y-Direction |
|---|---|---|
| Compressive Strength of Concrete, f'c (MPa) | 20 | 20 |
| Strength Reduction factor $\phi$ | 0.75 | |
| $\beta_n$ (For CTT Nodal Zone) | 0.6 | |

At face of Bottom Tie

| | X-Direction | Y-Direction |
|---|---|---|
| Area of Nodal Zone, Act (sq-mm) | 20000 | 20000 |
| Allowable Strength of Nodal Zone (kN) $\phi * \beta_n * 0.85 * f'c * Act$ | 153 | 153 |
| Maximum Difference in Tensile Force (kN) | 99.43 | 99.43 |
| Stress Ratio | 0.65 | 0.65 |

At face of Diagonal strut

| | X-Direction | Y-Direction |
|---|---|---|
| Area of Diagonal Strut at bottom, Acs (sq-mm) | 21999.7 | 21999.7 |
| Allowable Strength of Nodal Zone (kN) $\phi * \beta_n * f'c * Acs$ | 168.298 | 168.298 |
| Maximum Member Force (kN) | 110.58 | 110.58 |
| Stress Ratio | 0.657 | 0.657 |

Close

Design of Nodal Zones at Top

Calculation of strength as per ACI-318-08

|  | X-Direction | Y-Direction |
|---|---|---|
| Compressive Strength of Concrete, f'c (MPa) | 20 | |
| Strength Reduction factor $\phi$ | 0.75 | |
| $\beta$ n (For CCT Nodal Zone) | 0.8 | |

At face of top strut

|  | X-Direction | Y-Direction |
|---|---|---|
| Area of Top Chord, Acs (sq-mm) | 17000 | 17000 |
| Allowable Strength of Nodal Zone (kN) $\phi * \beta n * 0.85 * f'c * Acs$ | 173.4 | 173.4 |
| Maximum Member Force (kN) | 149.686 | 149.686 |
| Stress Ratio | 0.863 | 0.863 |

At face of Diagonal strut

|  | X-Direction | Y-Direction |
|---|---|---|
| Area of Diagonal Strut, Acs (sq-mm) | 21999.7 | 21999.7 |
| Allowable Strength of Nodal Zone (kN) $\phi * \beta n * 0.85 * f'c * Acs$ | 224.397 | 224.397 |
| Maximum Member Force (kN) | 110.58 | 110.58 |
| Stress Ratio | 0.493 | 0.493 |

Close

Design of Nodal Zone at Face of Vertical Members

Calculation of strength as per ACI-318-08

Compressive Strength of Concrete, f'c (MPa) — 20

Strength Reduction factor  φ — 0.75

β n  (For CTT Nodal Zone)
(Note : Bottom face of vertical member is critical.) — 0.6

Area of Vertical Member, Act (sq-mm) — 40000

Allowable Strength of Nodal Zone (kN)
φ * β n * 0.85 * f'c * Act — 306

Maximum Member Force (kN) — 32.045

Stress Ratio — 0.105

Close

Design Summary (Stress Ratios)

| | X-Direction | Y-Direction |
|---|---|---|
| Bottom Chord | 0.975 | 0.975 |
| Nodal Zone Bottom Chord | 0.65 | 0.65 |
| Top Chord | 0.691 | 0.691 |
| Nodal Zone Top Chord | 0.863 | 0.863 |
| Diagonal | 0.526 | 0.526 |
| Nodal Zone Diagonal at Top | 0.493 | 0.493 |
| Nodal Zone Diagonal at Bottom | 0.657 | 0.657 |
| Vertical Member | 0.512 | |
| Nodal Zone Vertical | 0.105 | |

Close

STRUT AND TIE METHOD FOR WAFFLE SLABS

BACKGROUND OF THE INVENTION

1. Field of the Invention

The present invention relates generally to computer modeling of waffle slabs, and particularly to a strut and tie method for waffle slabs providing a computerized method for the analysis and design of waffle slabs for the building and construction industries.

2. Description of the Related Art

Waffle slabs, also known as two-way ribbed flat slab, provide an economical and popular system in buildings and other types of structures. The waffle slab's increased rigidity compared to weight makes it economical for medium span structures. Also, interconnected ribs with a slab on the top ensures efficient lateral distribution of loads. They exhibit higher stiffness and small deflection. Waffle slab systems are commonly used in large auditoriums, parking garages, industrial facilities, marine structures and exhibition halls.

Problems with current design methods include the fact that the design methods neglect the existence of ribs and treat the slabs as solid slabs, and are approximate in nature. Finite element-based methods are also used for the design of waffle slabs. Conventional methods for the design of waffle slabs consider behavior for waffle slabs the same as flat plates or flat slabs. The effect of ribs, which are the primary load-carrying elements, is ignored in the analysis, and its effect on rigidity of the slab is arrived based on empirical formulae. Empirical methods currently being used do not predict the mode of failure of the waffle slab accurately. Instead, current methods restrict the parameters of the waffle, such as rib spacing, rib depth, rib thickness etc., to bring the slab in a desirable range where the empirical equations are more or less applicable.

Thus, a strut and tie method for waffle slabs solving the aforementioned problems is desired.

SUMMARY OF THE INVENTION

The strut-and-tie method for waffle slabs is a method for design and detailing of concrete structural members in which discrete representations of actual stress fields resulting from the applied loads and support conditions are considered, and provides a static lower bound solution. The load-carrying mechanism of a structural member is approximated by means of struts representing the flow of compressive stresses, ties representing the flow of tensile stresses, and nodal zones representing the point of intersection of struts and ties, which are subjected to a multi-axial state of stress.

The strut and tie method for waffle slabs models the waffle slabs to predict strength and mode of failure. Strut-and-tie models are known for analysis and design of concrete structures with pronounced D-regions. The present method utilizes a three-dimensional strut-and-tie model, which is applied to waffle slabs. Individual ribs in the slab form two-dimensional trusses, which are connected with perpendicular trusses at rib intersections. The geometry of the slab itself defines the location of nodes for finite element analysis.

These and other features of the present invention will become readily apparent upon further review of the following specification and drawings.

BRIEF DESCRIPTION OF THE DRAWINGS

FIG. 5 is a screenshot of a general data input screen in a strut and tie method for waffle slabs according to the present invention.

FIG. 6 is a screenshot of a waffle slab dimensions screen in a strut and tie method for waffle slabs according to the present invention.

FIG. 7 is a screenshot of a waffle wall details screen in a strut and tie method for waffle slabs according to the present invention.

FIG. 8 is a screenshot of a reinforcement and depth screen in a strut and tie method for waffle slabs according to the present invention.

FIG. 9 is a screenshot of a uniform distributed loads screen in a strut and tie method for waffle slabs according to the present invention.

FIG. 11 is a screenshot of a waffle slab bottom reinforcement design screen in a strut and tie method for waffle slabs according to the present invention.

FIG. 13 is a screenshot of a waffle slab deflection page in a strut and tie method for waffle slabs according to the present invention.

FIG. 16 is a screenshot of an ACI 318 strength calculation page in a strut and tie method for waffle slabs according to the present invention.

FIG. 17 is a screenshot of a top chord strength calculation page in a strut and tie method for waffle slabs according to the present invention.

FIG. 18 is a screenshot of a diagonal struts strength calculation page in a strut and tie method for waffle slabs according to the present invention.

FIG. 19 is a screenshot of a stirrups strength calculation page in a strut and tie method for waffle slabs according to the present invention.

FIG. 20 is a screenshot of a bottom nodal zone calculation page in a strut and tie method for waffle slabs according to the present invention.

FIG. 21 is a screenshot of a top nodal zone calculation page in a strut and tie method for waffle slabs according to the present invention.

FIG. 22 is a screenshot of a nodal zone at face of vertical members calculation page in a strut and tie method for waffle slabs according to the present invention.

FIG. 23 is a screenshot of a design summary page for stress ratios in a strut and tie method for waffle slabs according to the present invention.

Similar reference characters denote corresponding features consistently throughout the attached drawings.

DETAILED DESCRIPTION OF THE PREFERRED EMBODIMENTS

Figure 1:
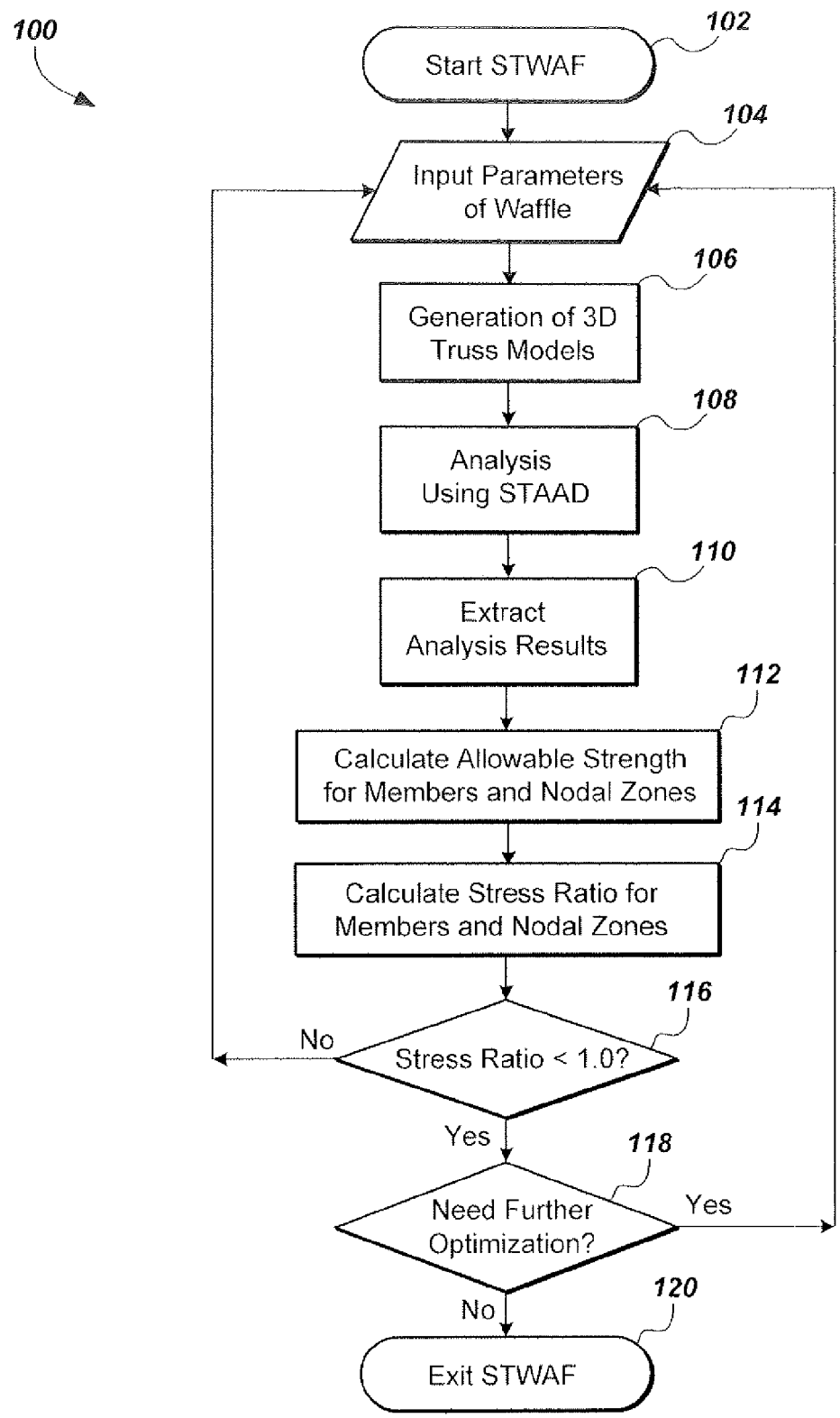
FIG. 1 is a flowchart of software implementing a strut and tie method for waffle slabs according to the present invention.

The strut and tie method for waffle slabs is a method that discretizes a waffle slab into a 3D truss model for analysis and design of the waffle slab. As used herein, "waffle slabs" refers to concrete slabs used, e.g., in the construction of floors and roofs. The slabs have a flat top surface. The bottom surface has a rectangular grid of deep ribs, giving the bottom surface the appearance of a waffle pattern. The floor areas between the ribs form thin flooring or roofing sections.

In the present method, ANSYS, a known general purpose finite element modeling package, can be used for verification of the strength and failure mode prediction method. The waffle slab is modeled using a 3D truss with strut and tie elements. The waffle slab is transformed into an equivalent 3D truss with strut and tie elements to predict strength and mode of failure. Ribbed slabs form a reinforced concrete structure. The strut-and-tie method for waffle slabs has been developed for analysis and design of the waffle slabs. The present method transforms the waffle slabs into a three-dimensional truss with strut and tie elements. Code provisions for strut-and-tie models have been adopted for design by both ACI 318-08 (2008) and the AASHTO LRFD Bridge Design Specifications (2005). It is used for analysis and design of deep, reinforced concrete beams, members with non-uniform geometry (such as corbels), pile caps, hammerheads, and pre-stressed concrete girders.

A new software application, STWAF, has been developed for performing on waffle slabs the strut-and-tie modeling steps of the present analysis and design method. Individual ribs in the slab form two-dimensional trusses, which are connected with perpendicular trusses at rib intersections. The geometry of the slab defines the location of nodes for finite element analysis. The STWAF software implementing the method has been developed specifically for waffle slabs, and can predict the strength more accurately than conventional methods used for waffle slab design. The method can also predict all major failure modes of a waffle slab. Even the effect of detailing aspects of a waffle slab is well obtained by the method.

The method provides a rational, safe, lower bound solution, as the collapse load is the highest lower bound solution that satisfies equilibrium and yield criteria. Different strut-and-tie models can be made for the same structure, but the strut-and-tie method cannot predict an exact failure mode and load. Conservatism should be used whenever the structure is to rely on tensile strength of concrete, such as an unreinforced bottle strut.

The presence of secondary steel, non-linear stress strain relationship of steel and concrete, tension capacity of concrete at reinforcement location and compression steel will contribute to the difference. Yun proposed a modified strut-and-tie model for deep beams considering nonlinearity of materials, presence of concrete at tie location and presence of compression steel and was able to obtain a good correlation with test results. The ability to redistribute stress after yielding of critical ties plays an important role in the large difference between predicted strength and test results.

The Bernoulli hypothesis states, "Plane sections remain plane after bending." This hypothesis is the basic assumption of flexural design of structural concrete by allowing linear variation in strain over the depth of the cross section. According to the Bernoulli hypothesis, any concrete structure may be subdivided into two regions. One is the B region in which the Bernoulli hypothesis is applicable, where the B stands for beam or Bernoulli. Another is D-region in which the Bernoulli hypothesis is not applicable, where the D stands for discontinuity or disturbed.

Based on the principle of St. Venant, the dimensions of the B and D regions are obtained. St. Venant's principle states, "The local distribution of forces acting on a small portion of a body subject to a stress field may be changed without changing the stress field in the body at some distance away from the point where the distribution was made." This principle suggests that local disturbance extends about one member depth each way from concentrated loads, reaction, or sudden changes in direction or section. Also, B regions carry load by beam action, and D-regions carry load primarily by arch action involving in-plane force.

There exists a truss design analogy for the design of the aforementioned B regions. The truss analogy is the shear design approach for reinforced concrete. The truss model introduced by Ritter in 1899 has been developed and adopted by most design specifications as the standard shear design method. The general design procedure for concrete includes selecting the concrete dimension, determining the size and the placing of reinforcement, and finally checking the serviceability. In the second step, the truss analogy is used to investigate the equilibrium of the external loads and internal force in the concrete and reinforcement. The truss model approach provides an excellent conceptual framework to show the internal forces that exist in a cracked structural concrete member.

Struts represent concrete compressive stress fields whose principal stresses are predominantly along the centerline of the struts. The shape of the strut stress field in planar D-regions may be idealized as prismatic, bottle-shaped, or fan-shaped. Struts may be strengthened by ordinary steel reinforcement, and if so, they are termed reinforced struts. In general, the stress limit of a strut is not the same as the uni-axial concrete compressive strength obtained from cylinder tests $f_c'$. It is defined as:

$$f_{cu} = v f_c'' \quad (1)$$

where $f_{cu}$ is the stress limit of a strut, commonly referred to as effective strength, and v is equal to the effectiveness factor, also known as efficiency factor or disturbance factor (typically between 0 and 1.0).

The effectiveness factor, v, is an empirical factor that is used to justify the application of limit analysis concept to structural concrete. It accounts for the difference in the post yielding response between the uni-axial compressive stress-strain curve used for deriving the limit analysis theorem, namely the (rigid or elastic) perfectly plastic curve, and that of typical concrete. If the uniform stress distribution is selected, the effective strut capacity is simply:

$$f_{cu} = A_c f_{cu} \quad (2)$$

where, $A_c$ is termed the effective cross-sectional area given by $A_c = w_c t$. With the same assumption, the effective capacity of reinforced concrete struts is:

$$f_{cu} = A_c f_{cu} + A_s f_y \quad (3)$$

where $A_s$ and $f_y$ are the cross-sectional area and the compressive yield strength of ordinary steel reinforcement, respectively.

Ties typically represent one or multiple layers of ordinary steel, in the form of flexural reinforcement, stirrups, or hoops. Ties can occasionally represent a pre-stressing steel or concrete stress field with principle tension predominant in the tie direction. The effective capacity of a tie consisting only of non-pre-stressed reinforcement is given by:

$$f_{tu} = A_s f_y \tag{4}$$

where, $A_s$ is the area of ordinary reinforcing steel, and $f_y$ is the yield strength of ordinary steel reinforcement in tension.

The tie reinforcement is usually assumed to be enclosed and uniformly distributed in a prism of concrete (smeared reinforcement). Termed "tie effective cross-sectional area", the cross sectional area of the concrete prism is $A_t$, where $A_t = w_t t$, where $w_t$ is the tie effective width, as known in the art. The tie capacity given in equation (4) can be rewritten in terms of equivalent stress assumed to be uniformly distributed across the effective cross-sectional area as:

$$f_{tu} = r_s f_y \tag{5}$$

where $r_s = A_s/A_t$ is the geometrical ratio of non-pre-stressed reinforcement.

Analogous to the joints in a structural steel truss, nodes represent regions in which forces are transferred between struts and ties. These regions are usually called nodal zones or nodal regions. Some literature (e.g. ACT 318-08) uses these terms slightly differently; a node refers to the meeting point of the strut axes, tie axes, and body forces acting on the node, whereas a nodal zone or nodal region refers to the finite dimension of a node.

Depending on the types of forces being connected, there are four basic types of nodes with three members intersecting, namely, CCC, CCT, CTT, and TTT, as known in the art, where $F_c$ and $F_t$ are strut and tie forces, respectively. Originally used for nodes with three members framing the terms CCC, CCT, and TTT are extended herein for convenience to include nodes with more than three members framing as follows. CCC nodes are those in which all the framing members are struts, CCT nodes are those in which one of the framing members is a tie, CCT nodes are those in which two or more of the framing members are ties, and TTT nodes are those in which all the framing members are ties.

Figure 4:
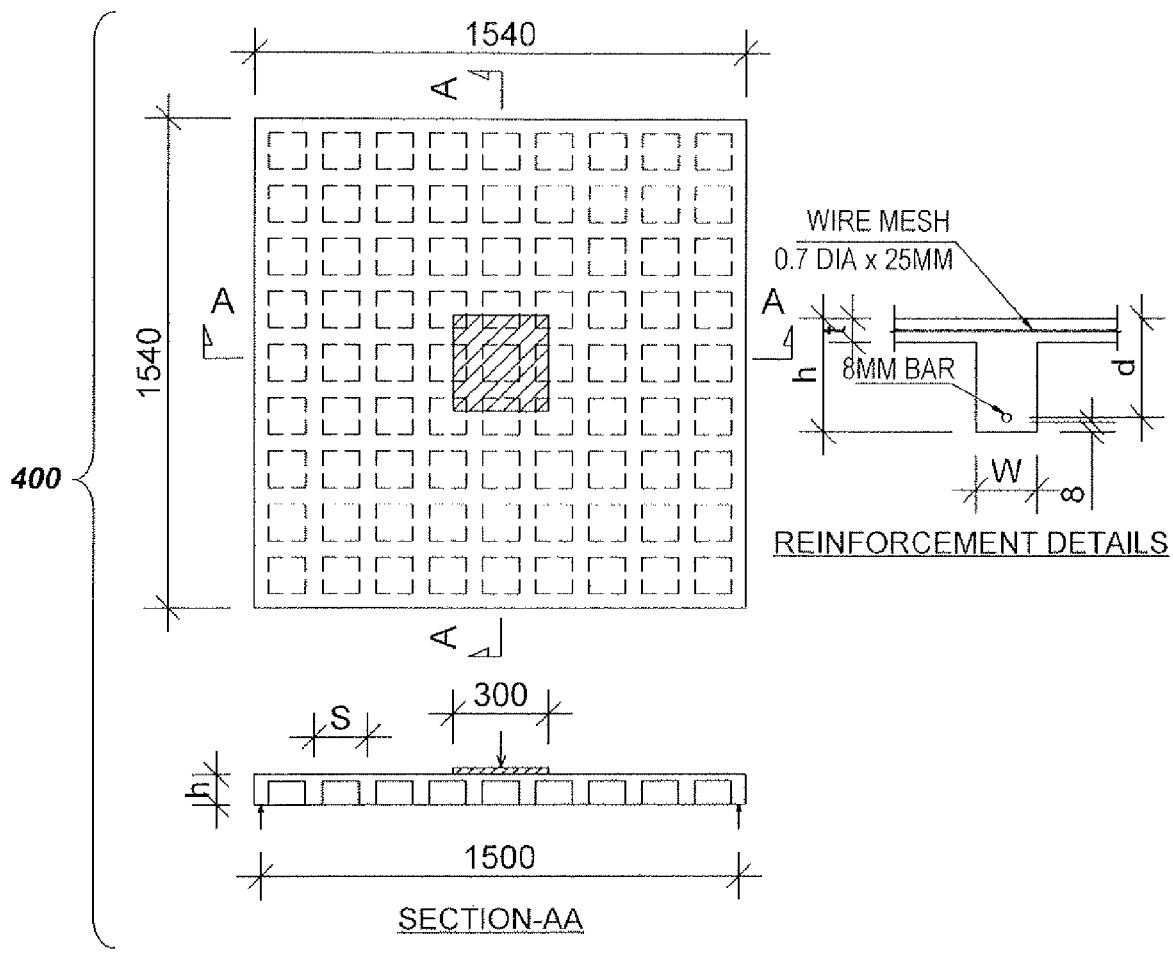
FIG. 4 is a test slab used to verify calculations by a strut and tie method for waffle slabs according to the present invention.

Most strut-and-tie models used in practice are 2-D models. A waffle slab comprises a regular pattern of voids at the bottom, which forms an orthogonal grid of ribs. A waffle slab, e.g., the test slab 400 shown in FIG. 4, is inherently 3-D in nature and needs a 3-D strut-and-tie model for simulating the transfer of loads. The intersecting ribs at close intervals transform the whole waffle slab as a D-region, and hence a strut-and-tie model provides a good insight into the flow of stresses. In the present method, the flow of internal forces in the D-region of the waffle slab is transformed into an indeterminate 3-D truss structure, which carries the imposed loading to the support.

For development of a 3-D truss structure for the waffle slab and to visualize the flow of forces, an elastic 3-D finite element model is made for a simply supported waffle slab in STAAD.Pro 2007, an existing structural analysis and design software package. The stress distribution for one of the ribs at the center of the slab is shown in plot 300 of FIG. 3E. As evident from plot 300, the ribs in both directions ensure load distribution in each direction, based on stiffness, at the intersection of the ribs, which is similar to a 3-D truss system.

Figure 3A:
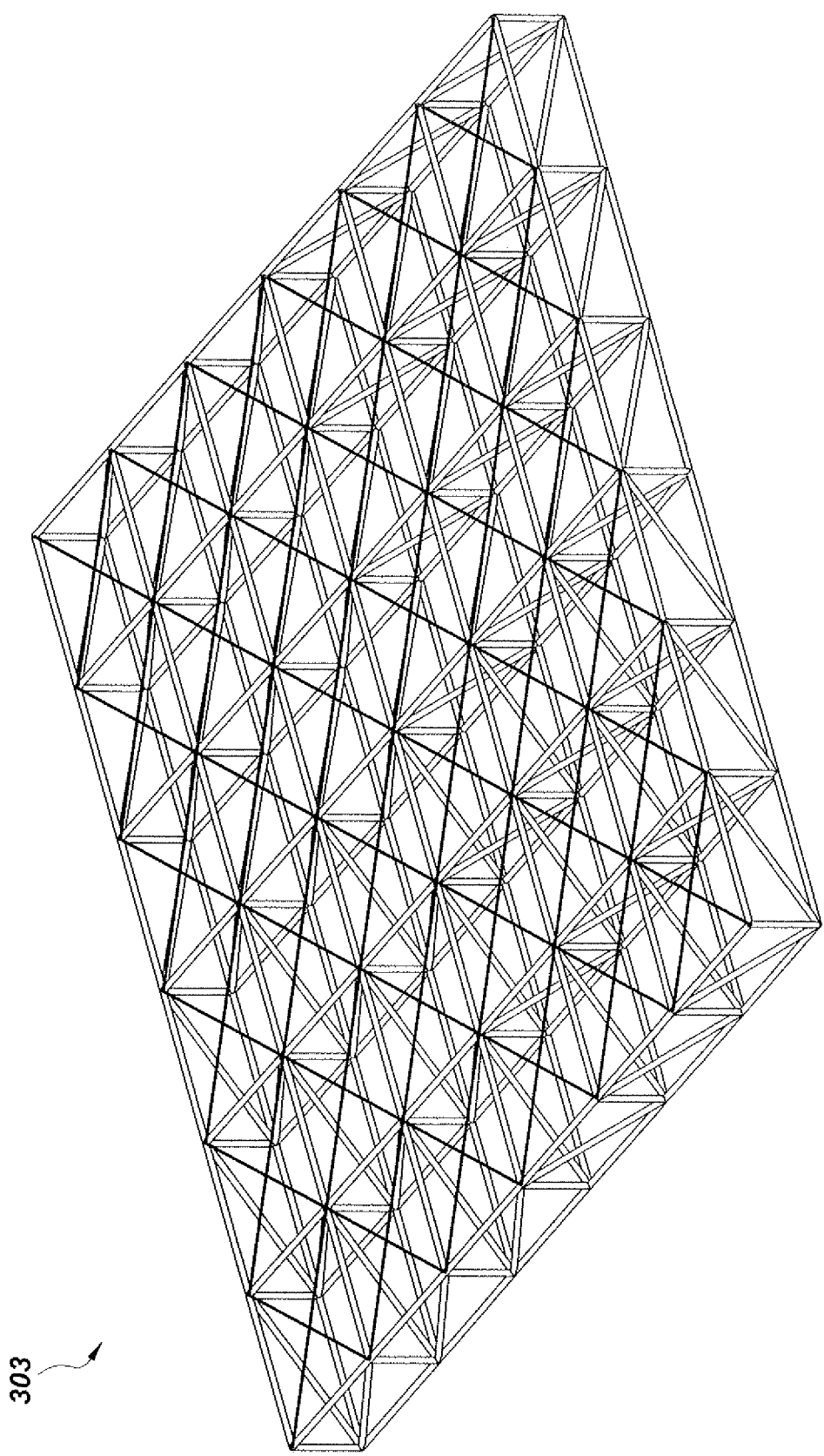
FIG. 3A is a three dimensional strut and tie model used for a strut and tie method for waffle slabs according to the present invention.

As shown in FIG. 3A, the truss structure 303 has bottom chords of each individual truss, which correspond to bottom reinforcement, while the top chords correspond to the prismatic concrete struts. The vertical members of the truss correspond to stirrup reinforcements. The joints of the truss represent nodal zones. Corner lifting is allowed. Compression only supports are provided at bottom peripheral nodes.

Figure 3B:
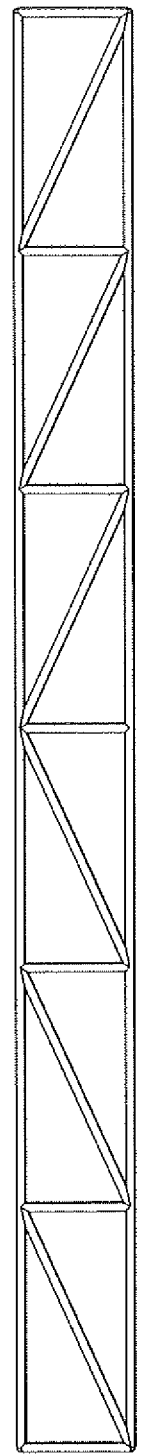
FIG. 3B is a single rib even number model used for a strut and tie method for waffle slabs according to the present invention.
Figure 3C:
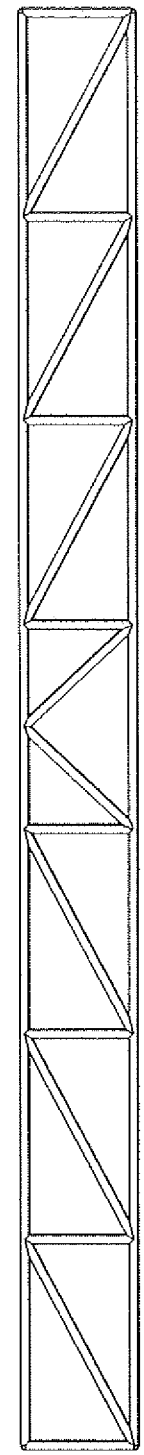
FIG. 3C is a single rib odd number model used for a strut and tie method for waffle slabs according to the present invention.
Figure 3D:
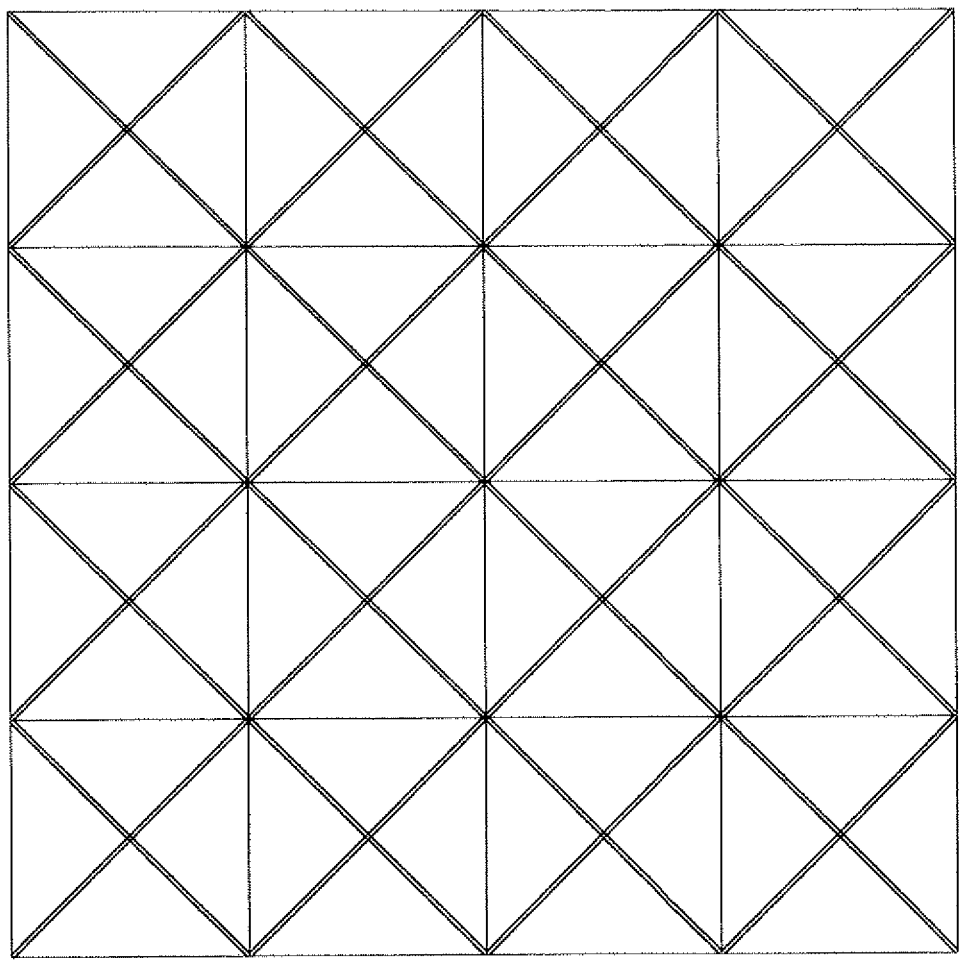
FIG. 3D is a top bracing model used for a strut and tie method for waffle slabs according to the present invention.
Figure 3E:
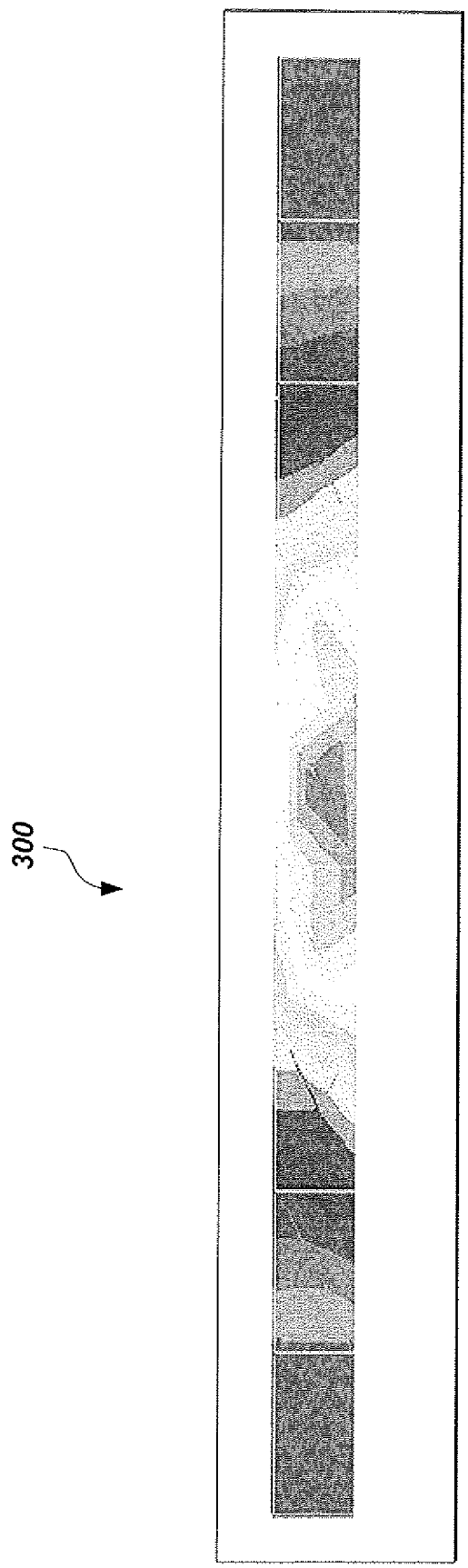
FIG. 3E is a STAAD plot showing stress distribution for one of the ribs at the center of the slab for a simply supported waffle slab according to a finite element model.

FIGS. 3B-3C show side view strut and tie models 310 and 301, respectively, for even and odd number waffle openings. As can be seen, individual ribs in each direction form two-dimensional trusses. Each truss is connected with perpendicular trusses at rib intersections. Cross-bracing is provided at the top to simulate the action of the exemplary concrete slab. The strut and tie model for top bracing 313 is shown in FIG. 3D. The top chord includes a prismatic concrete strut, which is within the top of the slab. The bottom chord includes the main reinforcement at the ribs. The vertical member corresponds to ties, which can be either stirrups or concrete tension ties in the case of waffle slabs without stirrup reinforcement. The inclined members consist of bottle-shaped concrete struts. The intersection of struts and ties is represented by nodal zones.

The top chord includes a prismatic concrete strut with thickness less than the slab thickness. The temperature steel provided in the slab can be ignored. Generally, in slabs, the top chord does not govern, and hence minimum thickness is recommended for optimization. When the thickness is reduced, the truss depth increases, and hence axial forces in the top chord and the bottom chord reduce. However, the thickness should be selected so that it is sufficient to avoid compression failure for the top struts. It can be obtained accurately by 2-3 trials. However, for practical design purposes, a larger thickness, such as half of the slab thickness, can be conservatively considered, since its effect of member forces is not significant.

The width of the top chord is calculated based on ACI formulae for effective width of flanges that can be considered along with the web for "T" sections, which is the minimum of the following: (a) width of rib+8 times the slab thickness; (b) width of rib+2 times the clear height of the rib below the slab; (c) center to center spacing of the ribs. The area of the top chord is calculated as thickness times width. The area is calculated separately for ribs in each direction if the waffle spacing is different. The area of a nodal zone for the top chord is the same as the area of the top strut. The modulus of elasticity of concrete is calculated as per the ACI formula, based on the compressive strength of concrete, $f_c'$. A linear stress strain curve is used for concrete.

The bottom chord includes steel reinforcement. The actual area of the steel, based on the number of reinforcement bars and the diameter of the bars, is provided in the model. An idealized bilinear stress strain curve is used for steel for calculating the ultimate load-carrying capacity of the test slabs. However, for design purposes, a linear stress strain curve is sufficient, since stresses are not allowed beyond the yield point.

For checking allowable stress for nodal zones, the area of a nodal zone is calculated as the width of the nodal zone times the thickness of the nodal zone. The width of the nodal zone is two times the effective cover of the bottom reinforcement. The thickness of the nodal zone is the same as the rib thickness.

For waffle slabs with stirrups provided in the rib, the vertical member includes a stirrup reinforcement provided at the intersection of the ribs. Stirrups provided in both directions can be added. The actual area of the steel, based on the number of stirrup legs and the diameter of the bars, is provided in the model. The modulus of elasticity of steel is used for slabs with stirrups.

For waffle slabs without stirrups, the vertical member includes concrete tension ties. The concrete at the intersection of ribs and a portion of concrete surrounding is effective. The area of a vertical member is calculated as Rib width×Rib width+Rib width×effective depth. The modulus of elasticity of concrete is used for slabs without stirrups.

A diagonal member includes a bottle-shaped concrete strut with a thickness the same as the rib thickness. The width of a diagonal member is calculated separately at top and bottom ends of the strut, and minimum is used for the design. Width of diagonal member=Rib width×sin θ+chord thickness×cos θ. The calculation at the bottom end is the rib thickness, and $w_t$ is the width of the bottom tie. "θ" is the angle that the diagonal strut makes with the bottom tie. The area of the diagonal member is calculated as thickness×width. The area is calculated separately for ribs in each direction if the waffle spacing is different. The area of the nodal zone for the diagonal strut is the same as the area of the strut. The modulus of elasticity of concrete is considered, as was considered for the top strut.

The bracing member includes a prismatic concrete strut having a thickness the same as the slab thickness. The width of the bracing member is calculated as follows. Width of bracing member=rib width×sin α+rib width×cos α, where α is the angle of inclination of the bracing with respect to the X-axis. The area of the bracing member is calculated as thickness×width. The modulus of elasticity of concrete is also used for bracing.

With respect to applying loads in the present method, all loads should be applied to the top joints of the truss. Self-weight is calculated for each node at the top, based on the tributary of the slab and the length of the rib. Additional dead loads and live loads to be applied are based on tributary and are applied at top joints. Suitable load factors should be considered (1.2 for dead load and 1.6 for live load as per ACI-318-2008), since the design is made for ultimate strength. The exemplary model is checked for vertical gravity loads.

With respect to the calculations, the nominal strength of elements for the method is calculated, as per ACI-318-08, is as follows. The maximum allowable factored load is the nominal strength multiplied by the strength reduction factor φ (=0.75 for all elements as per ACI-318). The stress ratio is defined as the ratio of actual force in the member÷Maximum allowable factored load.

The top chord is a prismatic concrete strut having a nominal strength calculated as $F_{ns}=f_{ce} \times A_{cs}$, where $A_{cs}$ is the cross sectional area of the strut. The effective compressive strength of the concrete, $f_{ce}$, in a strut shall be taken as $f_{ce}=0.85\beta_s f_c'$ where, $\beta_s=1.0$.

The bottom chord is steel reinforcement having a nominal strength calculated as $F_{nt}=\Omega A_{ts} f_y$, where, $A_{ts}$=Area of tensile steel reinforcement, $f_y$=Yield strength of steel reinforcement, and Ω=Overstrength factor of 1.25. Overstrength factor is considered for the bottom reinforcement, assuming that loads between ribs are shared, as is done in other methods with strips.

For waffle slabs with stirrups provided in the rib, the vertical member is a stirrup reinforcement and the nominal strength is calculated as, $$F_{nt}=A_{ts} \times f_y$$

where $A_{ts}$=Area of tensile steel reinforcement (stirrups) and $f_y$=Yield strength of steel reinforcement.

For waffle slabs without stirrups, the vertical members are concrete tension ties having nominal strength calculated as follows.

$F_{nt}=f_{tc} \times A_{ct}$, where $A_{ct}$ is the area of cross section of the concrete tie. The effective tensile strength of the concrete, $f_{te}$, in the concrete tension tie shall be taken as $f_{te}=\beta_t f_{ct}$ where $\beta_t=0.6$ (Considered for concrete tension tie). Direct tension capacity of concrete, $f_{ct}$, is considered as 0.33 $(f_c'^{1/2})$ (Mpa) and $4(f_c'^{1/2})$ in psi.

The diagonal members include bottle-shaped concrete struts having nominal strength calculated as follows.

$F_n=f_{ce} \times A_{cs}$ where, $A_{cs}$ is the area of cross section of the strut. The effective compressive strength of the concrete, $f_{ce}$, in a strut shall be taken as, $f_{ce}=0.85 \beta_s f_c'$ where, $\beta_s=0.75$ with stirrups provided in the ribs, and 0.60 without stirrups in the ribs.

Bracing member is a prismatic concrete strut and nominal strength is calculated as $F_{ns}=f_{ce} \times A_{cs}$ where, $A_{cs}$ is the area of cross section of the strut. The effective compressive strength of the concrete, $f_{ce}$, in a strut shall be taken as $f_{ce}=0.85\beta_s f_c'$ where, $\beta_s=1.0$.

All top nodes are CCT nodal zones since only one tie (vertical member) is anchored by these nodes. All bottom nodes are CTT nodal zones since two ties (vertical member and bottom tie) are anchored by these nodes. Nominal compressive strengths of nodal zones are calculated as follows:

$F_{nn}=f_{cc} \times A_{nz}$ where, $A_{nz}$ is the area of cross section of the nodal zone perpendicular to the line of action of force. The effective compressive strength of the concrete, $f_{cc}$, in a nodal zone shall be taken as $f_{ce}=0.85\beta_n f_c'$ where $\beta_n=0.80$ for CCT nodal zones (Top nodes), and 0.60 for CTT nodal zones (Bottom nodes)

For waffle slabs without stirrups, the tension capacity of concrete has to be checked for the maximum force in vertical member of the truss. Diagonal members of the truss correspond to concrete bottle-shaped struts. These diagonal members are so arranged that they carry only compression forces during analysis. In case of waffle slabs with stirrup reinforcement in ribs, which is generally the case, the spacing of vertical members can be reduced, and accordingly the angle of inclined struts will be more, which increases the width of inclined struts and shear capacity of the model.

The actual forces in the elements of the 3-D truss are compared with the strength of corresponding elements and nodal zones, calculated based on the American Concrete Institute (ACI) code. Force, including self-weight, is distributed to the joints in the top chord corresponding to tributary area. The exemplary slab 400 (shown in FIG. 4) is considered as simply supported at its edges.

A load test known by skilled artisans conducted on 1:4 scale specimens on waffle slabs with square lay-out of ribs was used for the verification of the present method for waffle slabs. Two out of six waffle slabs tested (S2 and S5) were considered for the verification.

The over all size of the exemplary slab 400 is 1540 mm×1540 mm for all specimens. The rib spacing (S) and slab thickness (t) for both selected specimens were 167 mm and 20 mm, respectively. Table 1 shows the details of each specimen. Yield strength of steel reinforcement was reported as 398 MPa.

TABLE 1

Dimensions of waffle slab specimens

| Slab Name | Rib Thickness W(mm) | Over all depth h (mm) | fc' MPa |
|---|---|---|---|
| S2 | 52 | 95 | 32.0 |
| S5 | 57 | 125 | 29.9 |

In the waffle slab 3-D strut-and-tie method, the thickness of the bottom tie, vertical ties, inclined strut and nodal zones at the bottom is taken as the thickness of the waffle rib. The thickness of the top strut and nodal zones at the top is taken as the effective width of the top slab and is less than or equal to the rib spacing.

The width of the bottom tie is considered as two times the effective cover of the bottom tie. The width of the top strut is considered as minimum based on its capacity for the given load. For the test slabs, a width of 10 mm considered which has a capacity more than that of the tie of 8 mm diameter. The truss depth is considered as the center-to-center distance of the top strut and the bottom tie. Inclination of the diagonal member is determined from the truss depth and rib spacing. The width of the inclined strut is evaluated at top and bottom and the minimum width is used in the model. The size of elements of the strut-and-tie model is shown in Table 2.

TABLE 2

Element sizes

| Slab Name | Width (mm) Top Strut | Thickness (mm) Top Strut | Width (mm) Bottom Tie | Width (mm) Bottom Tie | Width (mm) Inclined Strut |
|---|---|---|---|---|---|
| S2 | 10.0 | 167.0 | 24.0 | 52 | 32.3 |
| S5 | 10.0 | 167.0 | 24.0 | 57 | 33.7 |

Capacity of the elements of the truss and nodal zones are calculated as per ACI 318-08 (2008). These values tabulated in Table 3 are used for calculating stress ratios of each element in the design of exemplary waffle slab 400. Strength reduction factor is considered as 0.75 as per ACI.

TABLE 3

Capacity of elements of truss model

| Slab Name | Top Strut (kN) | Top Node (kN) | Bottom Tie (kN) | Bottom Node (kN) | Inclined Strut (kN) |
|---|---|---|---|---|---|
| S2 | 34.1 | 27.2 | 15 | 15.3 | 25.7 |
| S5 | 31.8 | 25.5 | 15 | 15.6 | 27.5 |

For verification of the present method, it is required to compare the stresses at ultimate failure load rather than safe working loads. Also material non-linearity needs to be investigated at failure load.

The reinforcing steel used for test specimen has a yield stress of 398 MPa. Average ultimate tensile stress around 1.8 times the yield stress and ultimate strain of 12% (Malvar and Crawford 1998) is considered in the model. For predicting ultimate strength of the waffle slab using the present method, strength reduction factor is not applied, which is a factor of safety by code.

For verification of the present method, analysis of the 3-D truss is performed using the software ANSYS-version 11.0. A non-linear analysis of the 3-D truss is carried out. In the non-linear model reinforcement is considered as a bi-linear isotropic material with modulus of elasticity considered up to yield point and a tangent modulus thereafter. Concrete is considered as a nonlinear elastic material in the model.

Table 4 shows the comparison of the results obtained from the present method and the test results. $P_u$-proposed is the limiting strength for the design of waffle slabs. The proposed ultimate concentrated load ($P_u$-proposed) corresponds to ACI formulae for capacity of strut-and-tie elements considering strength reduction factor $\phi=0.75$. Stress in reinforcing steel is limited to yield strength as per ACI 318.

Predicted strength (Pu-predicted) corresponds to the failure load where strength reduction factor is not applied and stress in reinforcing steel is considered up to ultimate tensile strain capacity. It can be seen from Table 4 that for slab S2, the percentage difference the nonlinear predicted load and actual test load is only 2.3% and for slab S5, it is 8.7%. The nonlinear model allows redistribution of stresses, and hence gives better prediction of the ultimate strength of the waffle slab compared to current methods.

TABLE 4

Predicted Strength and Test Results

| Slab Name | Pu-proposed kN (As per ACI) | Pu-predicted kN | Pu test kN |
|---|---|---|---|
| S2 | 31.0 | 79.1 | 81 |
| S5 | 43.0 | 109.6 | 120 |

A software program, STWAF, using Visual Basic implements the strut and tie method for waffle slabs 100 as 3-D truss. The program currently handles simply supported waffle slabs and accepts uniformly distributed and concentrated loads. As shown in the flowchart 100 of FIG. 1, the STWAF program is initiated in step 102. Parameters of the waffle structure are input at step 104. The 3-D truss model is generated at step, 106. The aforementioned STAAD analysis is performed at step 108. Analysis results are extracted at step 110. Allowable strength for the structural members and nodal zones is calculated at step 112. At step 114, structural member and nodal zone stress ratios are calculated. If the stress ratio is greater than one, step 116 directs processing back to step 104 for further parameter inputs. Otherwise, a check for further optimization is performed at step 118, and if no further optimization is required, the program exits at step 120.

Figure 2:
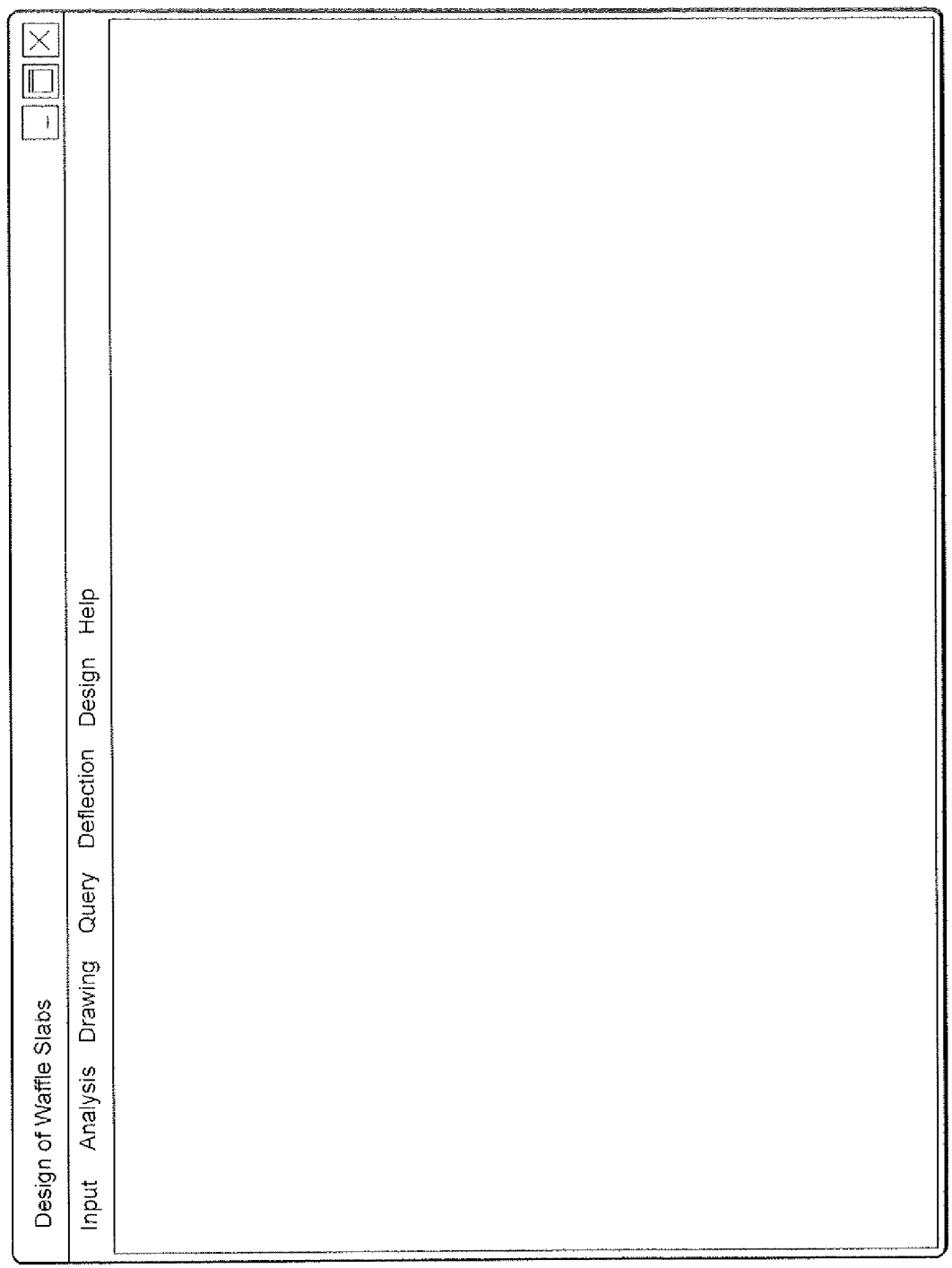
FIG. 2 is a screenshot of the main page of software implementing a strut and tie method for waffle slabs according to the present invention.

The software has a user interface for giving inputs such as material properties, overall size, details of waffle slab and loads. Screenshot 200 of FIG. 2 shows the main page of the user interface. The program generates the 3-D truss model and distributes the imposed loads as joint loads based on tributary areas.

Analysis of 3-D truss is carried out in the analysis module and the Visual Basic program extracts analysis results and the waffle slab is designed using strut-and-tie method as per ACI-318-08 (2008). The maximum stress allowed in ACI code for non-pre-stressed reinforcement is yield stress with a strength reduction factor of 0.75. Since the stress levels in the reinforcement is within the yield point of reinforcing steel, a linear stress-strain relation for the design of waffle slab is adopted in the program.

Figure 10:
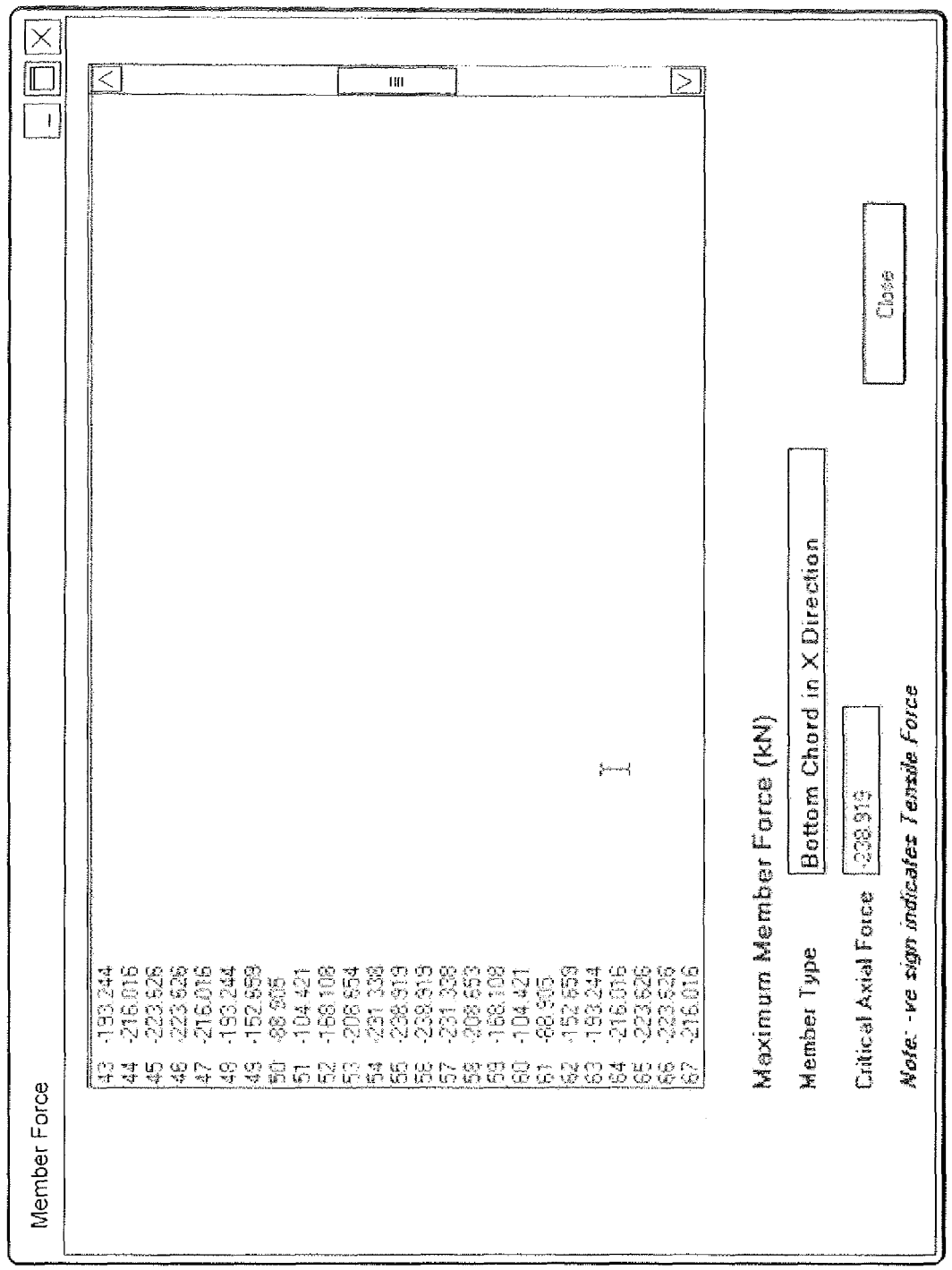
FIG. 10 is a screenshot of a member force screen in a strut and tie method for waffle slabs according to the present invention.
Figure 12:
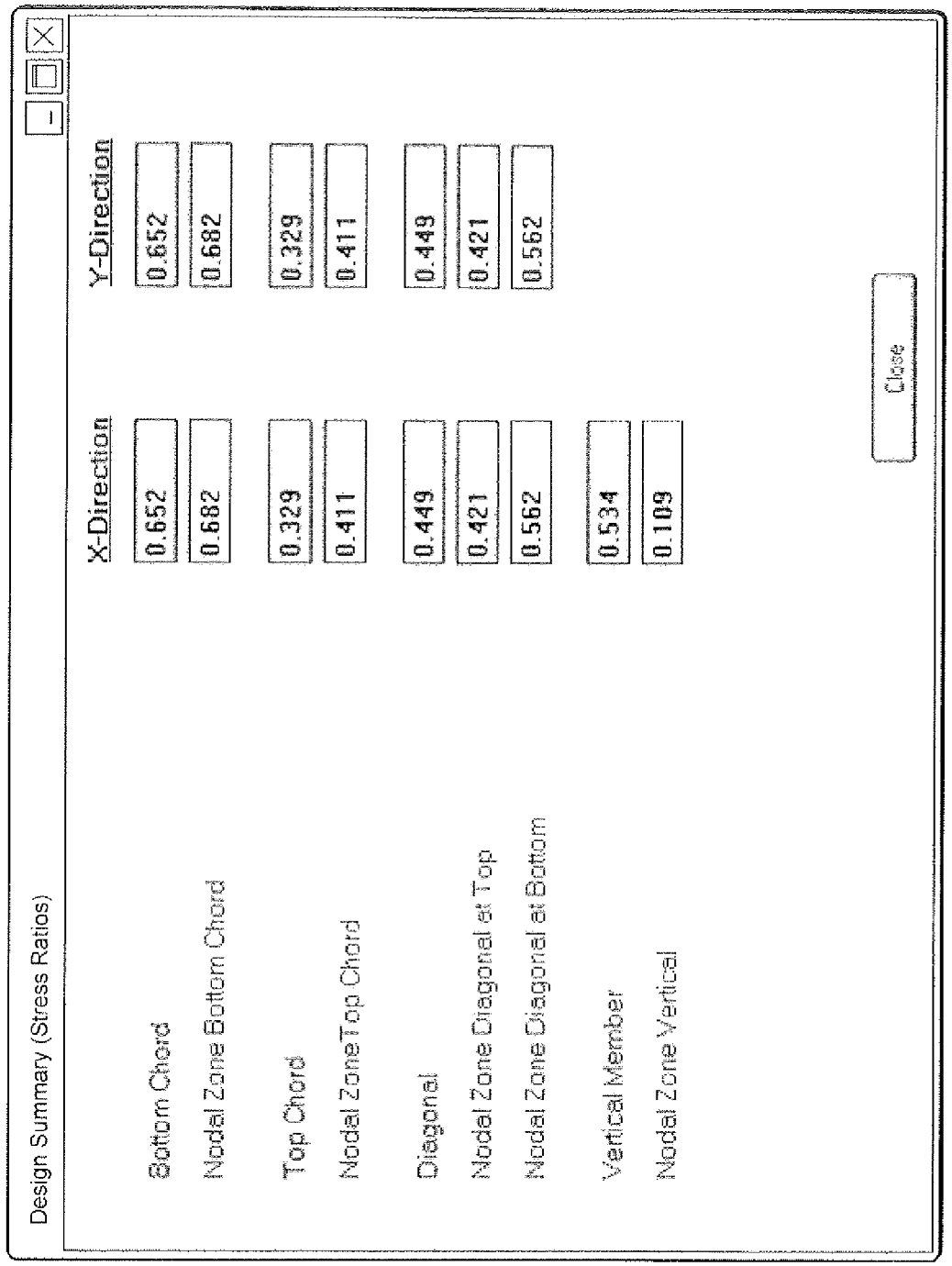
FIG. 12 is a screenshot of a stress ratios screen in a strut and tie method for waffle slabs according to the present invention.
Figure 14:
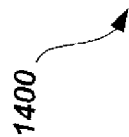
FIG. 14 is a screenshot of computed strut size screen in a strut and tie method for waffle slabs according to the present invention.
Figure 15:
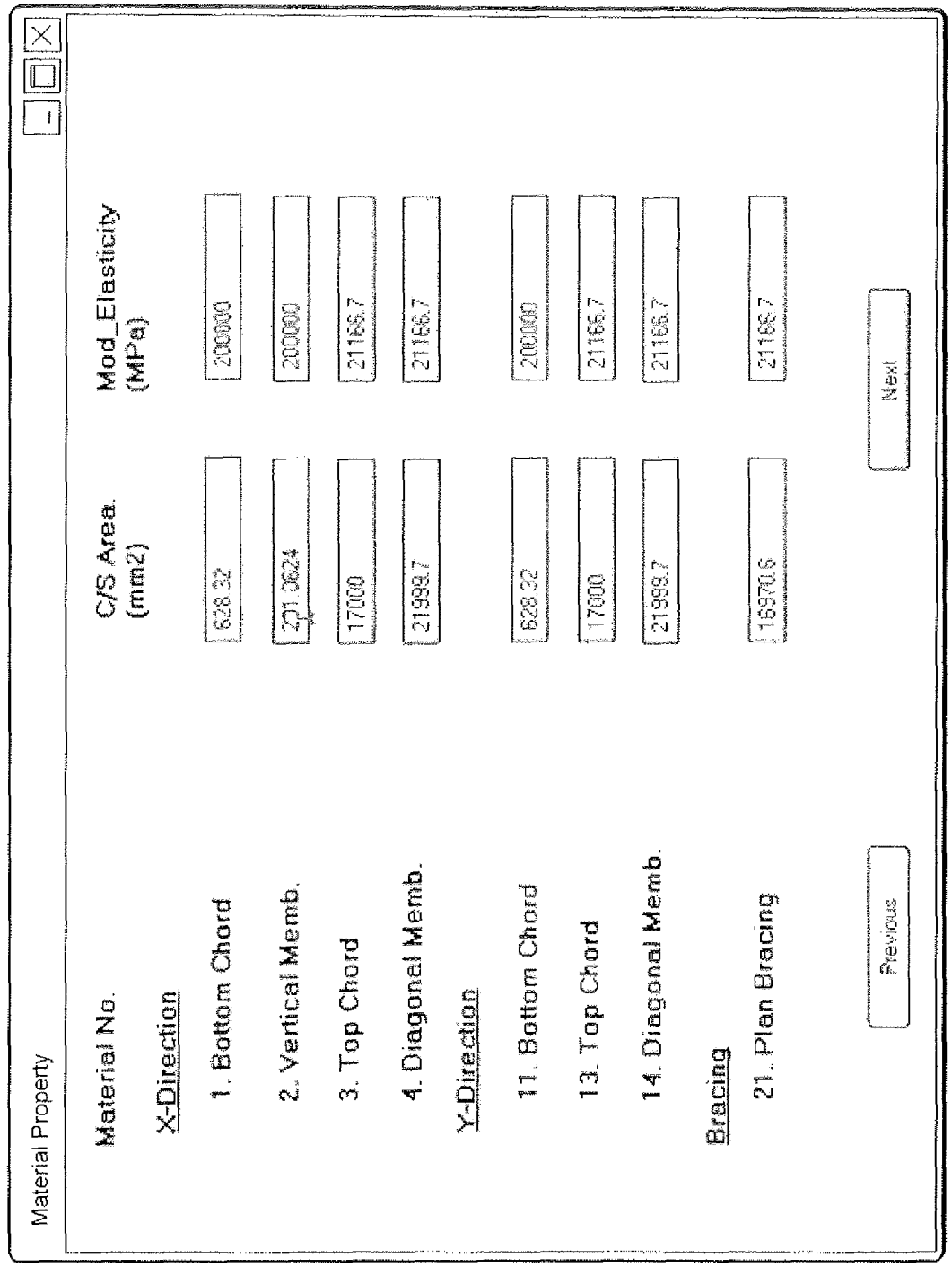
FIG. 15 is a screenshot of a waffle slab material properties page in a strut and tie method for waffle slabs according to the present invention.

The output of the program STWAF shows stress ratios for members and nodal zones. The user can interactively arrive at optimum dimensions of the waffle slab and required reinforcement for imposed loading. The program is under testing for various cases and load test results. The user interfaces are shown in FIG. 2, which is a screenshot 200 detailing the homepage of the STWAF program; in FIG. 5, which is a screenshot 500 detailing a page that allows users name, date concrete properties and reinforcement properties to be entered; in FIG. 6, which is a screenshot 600 detailing a page allowing for entry of waffle slab dimensions; in FIG. 7, which is a screenshot 700 detailing waffle wall details entry page; in FIG. 8, which is a screenshot 800 detailing reinforcement details and depth of compression block assumptions entry page; in FIG. 9, which is a screenshot 900 detailing load requirements entry page for uniformly distributed loads; in FIG. 10, which is a screenshot 1000 detailing critical axial force computed by the program for each member of the model; in FIG. 11, which is a screenshot 1100 of a page displaying design parameters and design procedure for bottom reinforcement; in FIGS. 12 and 23, which are screenshots 1200 and 2300, respectively, displaying the computed maximum stress ratios for all types of elements in the 3D truss model; in FIG. 13, which is a screenshot 1300 of a page displaying short-term and long-term deflections computed by the program; in FIG. 14, which is a screenshot 1400 displaying the strut sizes computed by STWAF for all types of struts from the given waffle slab dimensions; in FIG. 15, which is a screenshot 1500 of a page that summarizes the material properties computed for all types of elements; in FIG. 16, which is a screenshot 1600 of a page displaying design parameters and design procedure for bottom reinforcement; in FIG. 17, which is a screenshot 1700 of a page displaying design parameters and design procedure for top chord; in FIG. 18, which is a screenshot 1800 of a page displaying design parameters and design procedure for diagonal struts; in FIG. 19, which is a screenshot 1900 of a page displaying design parameters and design procedure for stirrups; in FIG. 20, which is a screenshot 2000 of a page displaying design parameters and design procedure for nodal zone at bottom; in FIG. 21, which is a screenshot 2100 of a page displaying design parameters and design procedure for top nodal zone; and in FIG. 22, which is a screenshot 2200 of a page displaying design parameters and design procedure for nodal zone at face of vertical members.

The waffle slab is inherently a 3-D structure. The intersecting ribs at close intervals transform the whole waffle slab into a D-region, and hence a three-dimensional strut-and-tie model is proposed for design of waffle slabs. The strut and tie method for waffle slabs predicts the ultimate load-carrying capacity of the waffle slab using a bi-linear stress-strain curve for reinforcing steel, which is close to the test results. The strut-and-tie method presents a unified approach for the design of waffle slabs, while addressing various modes of failure. The present method also contemplates incorporating multi-span waffle slabs and waffle slabs with beams on column lines.

It will be understood that the diagrams in the Figures depicting the strut and tie method for waffle slabs are exemplary only, and may be embodied in a dedicated electronic device having a microprocessor, microcontroller, digital signal processor, application specific integrated circuit, field programmable gate array, any combination of the aforementioned devices, or other device that combines the functionality of the strut and tie method for waffle slabs onto a single chip or multiple chips programmed to carry out the method steps described herein, or may be embodied in a general purpose computer having the appropriate peripherals attached thereto and software stored on non-transitory computer readable media that can be loaded into main memory and executed by a processing unit to carry out the functionality and steps of the inventive method described herein.

It is to be understood that the present invention is not limited to the embodiments described above, but encompasses any and all embodiments within the scope of the following claims.

We claim:

1. A computer-implemented strut and tie method for waffle slabs, comprising the steps of:
    building a 2-D strut and tie truss model for each rib in both directions, wherein for each 2-D truss, a bottom reinforcement represents a bottom tie, a portion of concrete top slab along the ribs represents a top strut, stirrups or concrete at rib intersection represents the vertical tie, nodes of trusses are defined by intersections of top and bottom chords with vertical ties, and a compressive force-resisting diagonal strut member interconnecting top and bottom nodes is provided lengthwise along each rib;
    connecting each 2-D strut and tie truss representing a rib to perpendicular trusses at rib intersections, thereby forming a 3-D strut and tie structural model defining a plurality of waffle openings;
    providing cross-bracing at the top of the 3-D strut and tie structural model, the cross-bracing simulating action of an exemplary three-dimensional concrete waffle slab;
    applying structural loads including self weight to the top nodes of the 3-D strut and tie structural model;
    analyzing the 3-D strut and tie structural model either by linear or 3-D nonlinear analysis to obtain an axial force in each said diagonal strut member;
    using said axial force in each said diagonal strut member in a design of each of the diagonal strut members;
    recommending a nonlinear analysis with nonlinear material properties;
    predicting strength and mode of failure of the slab based on the nonlinear analysis recommendation; and
    applying linear analysis at service loads when materials are in linear elastic range.

2. The computer-implemented strut and tie method for waffle slabs according to claim 1, further comprising the steps of:
    calculating stresses in concrete and steel from the diagonal strut member axial forces generated by said nonlinear analysis;
    comparing results of said stress calculating against actual strength of materials used for waffle slab thereby indicating critical members at failure; and
    providing user said comparing results thereby enabling said user to predict all major modes of failure comparing the criticality of each type of members in the 3D strut and tie structural model.

3. The computer-implemented strut and tie method for waffle slabs according to claim 1, wherein said linear analysis comprises the steps of:
    transforming the three-dimensional concrete waffle slab, based on user input, to a 3D-strut and tie model;
    applying said structural loads at said top and bottom nodes;
    performing a linear analysis with linear material properties;
    calculating resultant static forces approximating forces that would be present in said three-dimensional concrete waffle slab;
    calculating stress ratios for all said diagonal strut members;
    calculating stress ratios for nodal zones associated with all said diagonal strut members, the stress ratios calculating step being based on output from the resultant static forces calculating step;

displaying on a computer display device values representing the resultant static forces;

displaying on the computer display device values representing the stress ratios for all said diagonal strut members and said associated nodal zones; and displaying on the computer display device an advisory as to whether the values representing the resultant static forces and the stress ratios are within predetermined design guideline ranges.

4. The computer-implemented strut and tie method for waffle slabs according to claim 3, wherein said resultant static forces calculating step further comprises the step of calculating forces in regions of the 3-D strut and tie structural model in which forces are transferred between said diagonal strut members and tie members, said regions being nodal zones of the 3-D strut and tie structural model.

5. The computer-implemented strut and tie method for waffle slabs according to claim 4, further comprising the steps of:
 (a) analyzing said 3-D strut and tie structural model using structural analysis and design;
 (b) extracting results of said structural analysis and design analysis;
 (c) calculating stress ratio for said diagonal strut members and said nodal zones, said stress ratio being defined as a ratio of actual force in said diagonal strut members and said nodal zones divided by a maximum allowable factored load for said diagonal strut members and said nodal zones;
 (d) determining whether said 3-D strut and tie structural model requires optimizing; and
 (e) repeating said 3-D strut and tie structural model forming steps of claim 1 and steps (a) through (d) until no further optimizing is required.

6. The computer-implemented strut and tie method for waffle slabs according to claim 3, further comprising the step of providing a user interface, the user interface accepting user entry of concrete properties and reinforcement properties associated with the design of the three-dimensional concrete waffle slab.

7. The computer-implemented strut and tie method for waffle slabs according to claim 6, further comprising the step of accepting, via said user interface, user entry of depth and span measurements of the three-dimensional concrete waffle slab.

8. The computer-implemented strut and tie method for waffle slabs according to claim 7, further comprising the step of accepting, via said user interface, user entry of: rib thickness; rib depth; and for X and Y directions, number of waffle openings and waffle spacing.

9. The computer-implemented strut and tie method for waffle slabs according to claim 8, further comprising the step of accepting, via said user interface, user entry of rib bottom reinforcement information, stirrup reinforcement information, reinforcement cover information, and assumed depth of compression block information.

10. The computer-implemented strut and tie method for waffle slabs according to claim 9, further comprising the step of accepting, via said user interface, user entry of dead load, live load and load combinations information.

11. The computer-implemented strut and tie method for waffle slabs according to claim 10, further comprising the step of displaying, via said user interface, a calculated maximum member force for each member of said 3-D strut and tie structural model based on a user-entered member type and critical axial force for the member type.

12. The computer-implemented strut and tie method for waffle slabs according to claim 11, further comprising the step of displaying, via said user interface, a calculated strength of each type of diagonal strut member in the 3-D strut and tie structural model based on said predetermined design guideline ranges, the calculated strength display including said stress ratios.

13. The computer-implemented strut and tie method for waffle slabs according to claim 12, further comprising the step of displaying, via said user interface, a design summary of said stress ratios for bottom chord, nodal zone bottom chord, top chord, nodal zone top chord, diagonal, nodal zone diagonal at top, nodal zone diagonal at bottom, vertical member, and nodal zone vertical.

14. The computer-implemented strut and tie method for waffle slabs according to claim 13, further comprising the step of displaying, via said user interface, short-term and long-term deflections of said 3-D structural and tie structural model, said short term and long term deflections being calculated according to orthotropic plate theory.

15. The computer-implemented strut and tie method for waffle slabs according to claim 14, further comprising the steps of:
 computing top chord width, depth, and area information based on geometrical details provided by user;
 computing area of bottom chord based on reinforcement details provided by user;
 computing area of vertical tie members based on reinforcement details provided for stirrups by user;
 computing width, depth, and area information for diagonal members based on geometrical details provided by user; and
 computing width, depth, and area information for top bracing members based on geometrical details provided by user.

16. The computer-implemented strut and tie method for waffle slabs according to claim 15, further comprising accepting, via said user interface, user input of material properties associated with said bottom chord, said vertical tie members, said top chord, said diagonal members and said top bracing members.

17. The computer-implemented strut and tie method for waffle slabs according to claim 16, further comprising the step of displaying, via said user interface, a top chord design summary for critical top chord member, including: said top chord area, compressive strength of concrete, strength reduction factor for strut of uniform cross section $\beta$, allowable strength of strut, maximum member force, and said stress ratios.

18. The computer-implemented strut and tie method for waffle slabs according to claim 17, further comprising the step of displaying, via said user interface, a bottom reinforcement design summary for a critical bottom tie, including: area of reinforcement, yield strength of steel, strength reduction factor, over strength factor for reinforcement, allowable strength of tie, maximum member force, and a stress ratio of the critical bottom tie.

19. The computer-implemented strut and tie method for waffle slabs according to claim 18, further comprising the step of displaying, via said user interface, a diagonal struts design summary for a critical diagonal member, including: directional area of strut, compressive strength of concrete, strength reduction factor for strut of non-uniform cross section $\beta$, allowable strength of strut, maximum member force, and a stress ratio of the critical diagonal member.

20. The computer-implemented strut and tie method for waffle slabs according to claim 19, further comprising the step of displaying, via said user interface, a stirrups design summary for a critical vertical tie, including: area of reinforcement, yield strength of steel, strength reduction factor, allowable strength of tie, maximum member force, and a stress ratio of the critical vertical tie.

21. The computer-implemented strut and tie method for waffle slabs according to claim 20, further comprising the steps of:

displaying, via said user interface, a bottom nodal zone design summary, for critical node including: directional compressive strength calculation of concrete, strength reduction factor, compressive-tensile-tensile nodal zone $\beta_n$, face of bottom tie calculations including nodal zone area calculation, allowable strength calculation, stress ratio calculation, and maximum difference in tensile force calculation, face of diagonal strut calculations including area of diagonal strut at bottom, allowable strength of nodal zone, maximum member force, and a stress ratio of the bottom nodal zone;

displaying, via said user interface, a top nodal zone design summary for critical node including: directional compressive strength calculation of concrete, strength reduction factor, compressive-compressive-tensile nodal zone $\beta_n$, face of top strut calculations including top chord area calculation, nodal zone allowable strength calculation, stress ratio calculation, and maximum member force calculation, face of diagonal strut calculations including area of diagonal strut at face, allowable strength of nodal zone, maximum member force, and a stress ratio of the top nodal zone;

displaying, via said user interface, a nodal zones at face of vertical members design summary for critical node, including: compressive strength calculation of concrete, strength reduction factor, compressive-tensile-tensile nodal zone $\beta_n$, vertical member area calculation, nodal zone allowable strength calculation, a stress ratio calculation for the nodal zones at the faces of the vertical members, and maximum member force calculation; and displaying, via said user interface, design summary showing stress ratios for all types of critical nodal zones at top and bottom chords, including nodal zone for top chord members, nodal zone for bottom chord members, nodal zone for diagonal members at top, nodal zone for diagonal members at bottom, and nodal zones for vertical members at top and bottom.

* * * * *